United States Patent
Dasai et al.

(10) Patent No.: US 11,939,647 B2
(45) Date of Patent: Mar. 26, 2024

(54) TUNGSTEN TARGET

(71) Applicant: JX Nippon Mining & Metals Corporation, Tokyo (JP)

(72) Inventors: Takafumi Dasai, Ibaraki (JP); Shinichiro Senda, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 194 days.

(21) Appl. No.: 16/494,375

(22) PCT Filed: Jan. 26, 2018

(86) PCT No.: PCT/JP2018/002559
§ 371 (c)(1),
(2) Date: Sep. 16, 2019

(87) PCT Pub. No.: WO2018/179770
PCT Pub. Date: Oct. 4, 2018

(65) Prior Publication Data
US 2020/0016660 A1 Jan. 16, 2020

(30) Foreign Application Priority Data
Mar. 31, 2017 (JP) .................. 2017-070390

(51) Int. Cl.
*C22C 27/04* (2006.01)
*B22F 3/10* (2006.01)
(Continued)

(52) U.S. Cl.
CPC .............. *C22C 27/04* (2013.01); *B22F 3/10* (2013.01); *B22F 3/14* (2013.01); *B22F 3/15* (2013.01);
(Continued)

(58) Field of Classification Search
CPC .................................................. C23C 14/3414
See application file for complete search history.

(56) References Cited

U.S. PATENT DOCUMENTS 6,328,927 B1 * 12/2001 Lo .................. C22C 1/045
419/45
6,582,535 B1 6/2003 Suzuki et al.
(Continued)

FOREIGN PATENT DOCUMENTS

CN 103567443 A * 2/2014
JP 2003-55758 A 2/2003
(Continued)

OTHER PUBLICATIONS

CN 103567443 machine translation (Year: 2014).*
(Continued)

*Primary Examiner* — Paul A Wartalowicz
*Assistant Examiner* — Stephani Hill
(74) *Attorney, Agent, or Firm* — NIELDS, LEMACK & FRAME, LLC.

(57) ABSTRACT

There is provided a tungsten sputtering target that can provide a film deposition rate with less fluctuation over the target life. A tungsten sputtering target, wherein an area ratio of crystal grains having any of {100}, {110} and {111} planes oriented to a sputtering surface is 30% or less for any of the orientation planes, and an area ratio in total of crystal grains having orientation planes oriented to the sputtering surface other than {100}, {110} and {111} planes is 46% or more, the area ratio being obtained by an analysis of a cross section perpendicular to the sputtering surface with an inverse pole figure mapping using electron backscatter diffraction.

7 Claims, 1 Drawing Sheet

(51) Int. Cl.
  *B22F 3/14* (2006.01)
  *B22F 3/15* (2006.01)
  *C23C 14/34* (2006.01)
  *B22F 1/05* (2022.01)
(52) U.S. Cl.
  CPC .......... *C23C 14/34* (2013.01); *C23C 14/3414* (2013.01); *B22F 1/05* (2022.01); *B22F 2998/10* (2013.01)

(56) References Cited

U.S. PATENT DOCUMENTS

| 2005/0029094 A1* | 2/2005 | Watanabe | C23C 14/3414 |
| | | | 204/298.13 |
| 2008/0171215 A1* | 7/2008 | Kumar | C23C 14/3414 |
| | | | 419/39 |
| 2008/0271779 A1* | 11/2008 | Miller | B22F 1/052 |
| | | | 204/192.12 |
| 2011/0206944 A1 | 8/2011 | Uhlenhut et al. | |
| 2015/0023837 A1 | 1/2015 | Ohashi et al. | |
| 2016/0148790 A1 | 5/2016 | Suzuki et al. | |

FOREIGN PATENT DOCUMENTS

| JP | 2003193111 A * | 7/2003 | |
| JP | 2005-171389 A | 6/2005 | |
| JP | 3721014 B | 11/2005 | |
| JP | 2009-541584 A | 11/2009 | |
| JP | 2010-516892 A | 5/2010 | |
| JP | 4885065 B2 | 2/2012 | |
| JP | 2012-122139 A | 6/2012 | |
| WO | 03/016585 A1 | 2/2003 | |
| WO | 2007/147792 A1 | 12/2007 | |
| WO | 2008/089188 A1 | 7/2008 | |
| WO | WO-2009107763 A1 * | 9/2009 | ................ B22F 3/15 |

OTHER PUBLICATIONS

JP 2003-193111 machine translation (Year: 2003).*
Girault et al. Controlled nanostructuration of polycrystalline tungsten thin films. Journal of Applied Physics 113, 174310 (2013) (Year: 2013).*
WO 2009/107763 machine translation (Year: 2009).*
International Search Report dated Apr. 3, 2018 in corresponding PCT application No. PCT/JP2018/002559.
European communication dated Jan. 13, 2021 in corresponding European patent application No. 18778041.6.
International Preliminary Report on Patentability dated Oct. 3, 2019 in corresponding PCT application No. PCT/JP2018/002559.

* cited by examiner

[Figure 1]
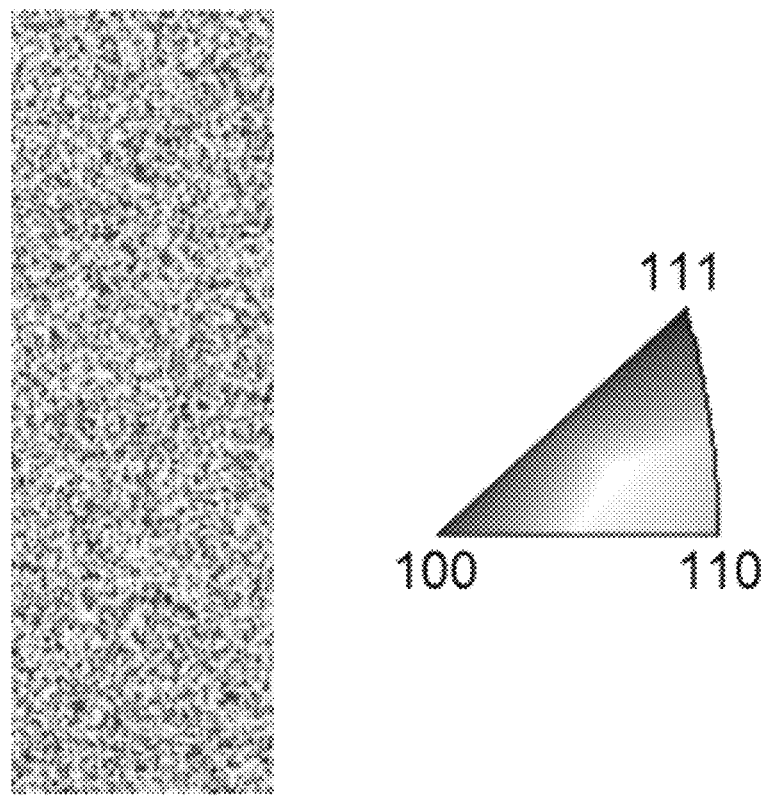
[Figure 2]
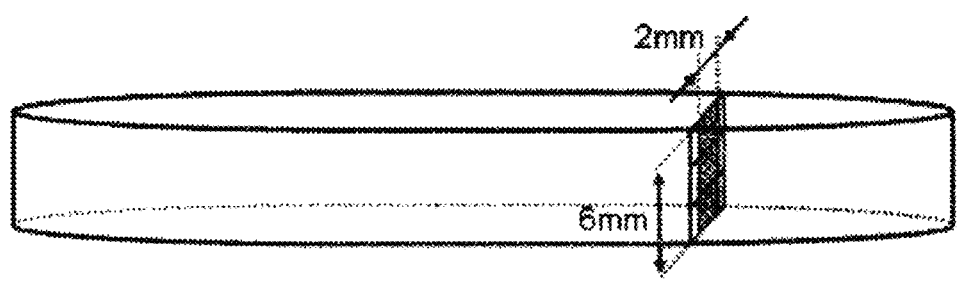

TUNGSTEN TARGET

TECHNICAL FIELD

The present invention relates to a tungsten sputtering target which is used, for example, for forming a contact and a wire of a semiconductor device.

BACKGROUND ART

Among wires for a semiconductor device, a wire which uses copper (Cu) having low resistivity has become generally used for a wire for a large-scale integrated circuit (LSI) such as a microprocessor (MPU), to which a high-speed operation is required. However, a material that is generally used still now as a material for the wire is aluminum (Al) which has been used for a long time and of which the process technology has been established; and this trend itself does not greatly change, and is considered to continue also in the future.

The semiconductor device generally has such a structure as to electrically isolate a space between a signal extraction part such as a source and a drain of a transistor and a wiring part, by an interlayer insulating film, and to secure an electric contact between the signal extraction part such as the source and the drain and the wiring part, through a fine hole referred to as a via which has been formed in a part of the interlayer insulating film. In this via, an electroconductive metal is embedded and results in securing the above described electric contact; and the structure of this portion is occasionally referred to as a contact hole, a contact plug or the like.

As for a tendency of the conventional technological development of the semiconductor device, thinning of in-circuit wiring has been progressed along with miniaturization due to the enhancement of the degree of integration of elements. Miniaturization of the structure of the wiring part and a contact plug part as well as thinning of a wire diameter have also been progressed. As the miniaturization and the thinning of the wiring part and the contact plug part progress, a density of an electric current flowing therethrough increases, and heat generation by Joule heat also becomes a problem. In addition, in the case where Al is used in the above described wiring part, and particularly in the contact plug, element failures cannot be ignored which originate from electromigration or stress migration of the Al material.

The electromigration is a phenomenon in which metal ions move along a flow of an electric current caused by the electric current passing through a conductor such as a metal material. When the phenomenon is viewed regarding an Al contact, Al ions move in the direction of the electron flow, then finally, the number of Al atoms which exist on the cathode side decreases, and a void is generated; and the electrical contact between the wire and the semiconductor signal extraction part becomes impossible, which results in causing a disconnection failure. In addition, on the anode side, a hillock or a whisker grows due to excessive Al atoms, which finally leads to a short circuit failure in which the wire comes in electrical contact with another undesirable portion. In addition, the stress migration is a phenomenon in which the wiring material physically moves because of the stress that is applied to the wiring material due to the difference in a coefficient of thermal expansion between the interlayer insulating film and the wiring material. A void also occurs in the wiring material also due to the phenomenon and causes the disconnection failure, and this phenomenon becomes easy to occur as the diameter of the wiring material decreases.

Then, as for the wire of the semiconductor device, particularly, in a contact plug part, tungsten is used to address the above described problem since it has a comparatively low resistivity, a good electromigration resistance, a smaller coefficient of thermal expansion compared to that of Al, and a good stress migration resistance. Tungsten is a thermally stable and also chemically stable material, and is thus suitably used for the contact plug part or the wiring material of the semiconductor device.

In the case where the wiring contact plug of the above described semiconductor device is formed of tungsten, the process includes forming an interlayer separating layer, forming the via at a contact position with the source or the drain, and pouring the tungsten into the via. During this process, a method is often employed which includes firstly forming a thin uniform seed layer of tungsten by sputtering in order to promote the formation of a tungsten layer in the via. After the seed layer has been formed, a layer by which the via is embedded is formed by a process such as sputtering under conditions that the film deposition rate is higher, CVD, plating or the like. In order to obtain the contact and the wire which have uniform and good electroconductive characteristics, it is an important technology to form the seed layer having good characteristics by sputtering. In addition, it goes without saying that the sputtering technology of the tungsten is important for not only for forming the seed layer but also for forming the layer for embedding the plug or the wiring layer itself with tungsten.

When the tungsten layer is formed by sputtering, a sputtering target made of tungsten metal shall be used. When the sputtering film-deposition is performed, such problems often occur that coarse particles which are referred to as "particle" is produced during the film deposition, the coarse particles adhere to a formed tungsten layer, causing a defect. Some of the particles are considered to be released in a bulk state from a structure in the sputtering target due to abnormal discharge or the like. Patent literatures 1 to 3 study the particle.

CITATION LIST

Patent Literature

Patent Literature 1: Japanese Patent Laid-Open No. 2003-055758
Patent Literature 2: Japanese Patent No. 3721014
Patent Literature 3: Japanese Patent No. 4885065

SUMMARY OF INVENTION

Technical Problem

An object of the present invention is to provide a sputtering target that can exhibit a stable sputtering performance throughout the target life.

Solution to Problem

In order to solve the above described technical problems, the present inventors have made an extensive investigation, and consequently have discovered findings that in order that the target does not greatly change its film deposition rate even if having been sputtered for a long time, it is effective to prepare such a metallographic structure that none of three main orientation planes is preferentially oriented in a cross section perpendicular to a target sputtering surface. The present invention has been completed based on the findings with additional investigation and consideration.

Based on the above described findings and results, an embodiment of the present invention provides the following tungsten sputtering target.

1) A tungsten sputtering target, wherein an area ratio of crystal grains having any of {100}, {110} and {111} planes oriented to a sputtering surface is 30% or less for any of the orientation planes, and an area ratio in total of crystal grains having orientation planes oriented to the sputtering surface other than {100}, {110} and {111} planes is 46% or more, the area ratio being obtained by an analysis of a cross section perpendicular to the sputtering surface with an inverse pole figure mapping using electron backscatter diffraction.

2) the sputtering target according to the above 1), wherein the area ratio of {100} is in a range of 10.2±3%, the area ratio of {110} is in a range of 20.4±3%, and the area ratio of {111} is in a range of 13.6±3%, and the area ratio of the other crystal grains is 55.7%±9%.

3) the sputtering target according to the above 1) or 2), wherein a relative density is 99.0% or higher;

4) the tungsten sputtering target according to any one of the above 1) to 3), wherein a standard deviation of the area ratio of crystal grains having any of {100}, {110} and {111} planes oriented to the sputtering surface is 3% or smaller for any of the orientation planes.

5) the tungsten sputtering target according to any one of the above 1) to 4), wherein a standard deviation of the area ratio in total of crystal grains having orientation planes oriented to the sputtering surface other than {100}, {110} and {111} planes is 3% or smaller.

6) the tungsten sputtering target according to any one of the above 1) to 5), wherein an average crystal grain size is 50 μm or smaller;

7) the tungsten sputtering target according to any one of the above 1) to 6), wherein a standard deviation of an average crystal grain size on the sputtering surface is 3% or smaller.

8) the tungsten sputtering target according to any one of the above 1) to 7), wherein an oxygen content is 50 wtppm or less.

Advantageous Effects of Invention

According to the present invention, a stable and uniform film deposition rate over the target life can be maintained.

BRIEF DESCRIPTION OF DRAWINGS

FIG. 1 shows an analysis example of an inverse pole figure mapping image with the use of EBSD.

FIG. 2 shows a sample used in EBSD measurement.

DESCRIPTION OF EMBODIMENTS

A sputtering target of the present embodiment consists of tungsten metal except for unavoidable impurities, The shape of the sputtering target may be a general disk shape, a rectangular flat shape, a cylindrical shape and the like, and is not limited in particular, However, it is important that an orientation state with respect to a sputtering surface has a random orientation in which none of the three main orientation planes is preferentially oriented to the sputtering surface. The orientation state is analyzed from the mapping image obtained when the orientation of the crystal structure on the cross section perpendicular to the main surface which is the sputtering surface of the target is measured by the electron backscatter diffraction (EBSD). According to the EBSD measurement, the orientation characteristics on the sputtering surface side of each point can be grasped from the orientation characteristic mapping image of the cross section, and accordingly if the crystal orientation mapping image of the target cross section is analyzed by EBSD, it becomes possible to collectively observe continuous distribution and change of the crystal orientation characteristics of the sputtering surface, over the depth direction of the target.

In the sputtering film-deposition, the sputtering surface of the target is consumed as the sputtering progresses, and erosion progresses toward a direction of thickness (depth) perpendicular to the sputtering surface. Then, a new sputtering surface continuously emerges in the deep position from the surface of the target. Accordingly in order to achieve a process in which the film deposition rate is stable even though the sputtering film-deposition is performed for a long time, a sputtering target is required to have uniform characteristics not only within the sputtering surface of the target but also in the cross section in the thickness direction perpendicular to the sputtering surface.

Tungsten is a metal having a body-centered cubic (bcc) structure as a crystal structure, and in consideration of the symmetry of the crystal structure, three plane orientations of {100}, {110} and {111} can be considered to be basic main orientation planes. The tungsten sputtering target of the present embodiment uses it as an indicator of random orientation that an area ratio of crystal grains having any of {100}, {110} and {111} planes oriented to the sputtering surface is 30% or less for any of the orientation planes, and an area ratio in total of crystal grains having orientation planes oriented to the sputtering surface other than {100}, {110} and {111} planes is 46% or more when EBSD measurement is performed on a cross section perpendicular to the sputtering surface as previously described, and the orientation state of crystal grains with respect to the sputtering surface is analyzed from the result. Note that "oriented to" mentioned here is a concept which contains a deviation within 15° with respect to the sputtering surface, as will be described later.

The orientation structure of the crystal structure in the cross section perpendicular to the sputtering surface of the target described above can be evaluated directly from the inverse pole figure mapping image (IPF; also referred to as crystal orientation mapping image) which is obtained from EBSD measurement. FIG. 1 is an example of an IPF mapping image which has been obtained by EBSD measurement of the whole area (2 mm in direction horizontal to target surface and 6 mm in thickness direction) on the cross section of the sputtering target in the present embodiment. In the IFF mapping image, on the basis of pole figure data by EBSD at each position corresponding to each crystal grain in the target cross-sectional structure, an orientation direction of the crystal at the position is analyzed, and then the orientation of each of the crystal grains becomes visually directly shown. In this orientation mapping image, for each of the orientations of the three main orientation planes of {100}, {110} and {111}, the area ratio of crystal grains oriented to the sputtering surface within 15° from these orientation planes is calculated according to the following expression, and furthermore, the area ratio of crystal grains having plane orientations oriented to the sputtering surface other than these three main orientation planes is calculated according to the following expression.

> Expression: area ratio=(area of intended orientation (including deviation of 15°)/area of all orientations)×100(%)

In the present embodiment, the concept of the crystal grains having {100}, {110} and {111} planes oriented to the sputtering surface incudes crystal grains having the orientation plane within 15° from {100} when the crystal grain observed on the observation surface is viewed for the orientation plane with respect to the sputtering surface. The concept is similar to that for the other main orientation planes {110} and {111}, Then, crystal grains oriented to an orientation which deviates from any of these three plane orientations by an angle exceeding 15° are treated as crystal grains having orientation planes with respect to the sputtering surface other than the three main orientation planes.

The crystal structure of the target described above needs to be achieved at least in a region where the target material is sputtered by plasma ion impact on the target surface and the target is subjected to erosion. The sputtering film-deposition is usually performed with the use of a sputtering apparatus which has a magnetron type cathode, from the viewpoint of film-deposition efficiency. The most commonly and widely used magnetron type cathode has a structure in which a magnetic pole opposing to a magnetic pole of the central portion concentrically surrounds the periphery of the central magnetic pole so that magnetic field lines heading from the center to the periphery (or vice versa) are formed in a tunnel form on the target surface, and a region between the magnetic pole at the central portion and that at the periphery traps plasma, enhancing the sputtering efficiency in this region. Therefore, in the present embodiment, as for a position at which the cross section perpendicular to the surface of the target is analyzed, a predetermined one point in the middle (r/2 where r represents radius of target) between the central portion and the outer circumferential portion on the target surface is adopted as a representative point. Because, it is considered from an actual production process of the sputtering target that the characteristics of the sputtering target are uniform over the surface, and accordingly it may be considered that points other than the representative point also have essentially the same and uniform characteristics.

In the present embodiment, at predetermined one point in the middle (r/2 where r represents radius of target) between the central portion and the outer circumferential portion on the target surface, the cross section perpendicular to the sputtering surface of the target is equally divided into three in the thickness direction; a square region or a rectangular region of 2 mm in the width direction (direction parallel to the sputtering surface)×(target thickness÷3) mm in the thickness direction (direction perpendicular to the sputtering surface) in each of the equally divided three regions is subjected to IPF mapping evaluation by EBSD; and the above described area ratio is calculated from the mapping image in each of the regions. Then, the average value of the area ratios of the three regions which have been equally divided into three in the thickness direction is calculated, and the obtained value is used as an evaluation value which indicates the orientation characteristics of the whole cross section. A random structure in which the area ratio of the crystal grains having any of {100}, {110} and {111} planes oriented to the sputtering surface, which have been evaluated in this manner, is 30% or less for any of the orientation planes, and the area ratio in total of crystal grains having orientation planes oriented to the sputtering surface other than {100}, {110} and {111} planes, is 46% or more, can reduce fluctuation in the deposition rate in sputtering. In particular, when the area ratio of {100} is 10.2±3%, the area ratio of {110} is 20.4±3%, the area ratio of {111} is 13.6±3%, and the area ratio of the other crystal grains is 55.7%±9%, the effect of suppressing the fluctuation in the deposition rate in the sputtering is high. Furthermore, it is preferable for the area ratio in total of crystal grains having orientation planes oriented to the sputtering surface other than {100}, {110} and {111} planes, to be 48% or more, and more preferable to be 50% or more, and is still more preferable to be 52% or more, from the viewpoint of suppressing the fluctuation in the deposition rate in the sputtering.

It works effectively on the suppression of the fluctuation in the deposition rate in sputtering to control the crystal orientation of the above described three main orientation planes of {100}, {110} and {111} and the crystal orientation of planes other than the three main orientation planes. In addition to the above, it works effectively on the further suppression of the fluctuation of the deposition rate over time to densify the target. The reason is not necessarily clear, but it is assumed to be one of the reasons that when the target density is low and a large number of fine grain boundaries and pores exist in the structure, these fine non-crystalline phases irregularly emerge along with the progress of erosion associated with sputtering. The sputtering rate thus becomes unstable over time, which leads to fluctuation in the deposition rate over time. From such a viewpoint, it is preferable for the relative density of the sputtering target of the present embodiment to be 99.0% or larger, and more preferable to be 99.2% or larger. Incidentally, the relative density in the present embodiment is expressed by a ratio of the measurement evaluation density of tungsten, which is evaluated by the Archimedes method, to 19.3 g/cm$^3$, that is the theoretical density of tungsten, as is represented by the following expression.

> Relative density=(Archimedes density/theoretical density (tungsten: 19.3 g/cm$^3$))×100(%)

It is preferable for the sputtering target of the present embodiment that a standard deviation of the area ratios of crystal grains having any of {100}, {110} and {111} planes oriented to the sputtering surface to be 3% or smaller for any of the orientation planes. As has been previously described, in the present embodiment, after the cross section perpendicular to the sputtering surface of the target is equally divided into three in the thickness direction, the orientation of the crystal grain is evaluated in each of the equally divided three regions. The standard deviation of the area ratios of the crystal grains having any of {100}, {110} and {111} planes oriented to the sputtering surface means a standard deviation calculated from the results of the three regions obtained by equally dividing the target cross section into three in the thickness direction. From the viewpoint of orientation uniformity in the cross section, it is more preferable for the standard deviation of the area ratios of crystal grains having any of {100}, {110} and {111} planes oriented to the sputtering surface to be 1% or smaller, and still more preferable to be 0.8% or smaller for any of the orientation planes.

In addition, it is preferable for the sputtering target of the present embodiment that a standard deviation of the area ratios in total of crystal grains having orientation planes oriented to the sputtering surface other than {100}, {110} and {111} planes is 3% or smaller. This standard deviation also means a standard deviation that has been calculated from the evaluation results of three regions which are obtained by equally dividing the target cross section into three in the thickness direction. Concerning this standard deviation as well, it is more preferable for the standard deviation of the area ratio in total of crystal grains having planes oriented to the sputtering surface other than {100}, {110} and {111} planes, to be 1.5% or smaller, and still more preferable to be 1.3% or smaller, from the viewpoint of the orientation uniformity in the cross section.

A grain size of the crystal grain in the sputtering target affects mechanical characteristics such as a strength of the target, the uniformity of the structure, as well as the deposition rate, and the degrees of abnormal discharge and particle generation. Accordingly, it is effective to appropriately control the grain size. In the sputtering target of the present embodiment, the average crystal grain size is preferably 50 μm or smaller. If the average crystal grain size exceeds 50 μm, the stability of the deposition rate is affected to be degraded, in addition, there is a tendency that the abnormal discharge and the particle generation associated with the abnormal discharge increase. Furthermore, the target body becomes brittle due to coarsening of the particle size, and the mechanical strength decreases, too. In the present embodiment, also concerning the crystal grain size, the average crystal grain size is evaluated in each of the three regions obtained by equally dividing the target cross section into three in the thickness direction, and the average value of the three regions is determined as the total evaluation value. It is more preferable for the average crystal grain size to be 40 μm or smaller, and still more preferable to be 35 μm or smaller. In addition, an evaluation method of the average crystal grain size, which is adopted in the present embodiment, is a method of determining the average crystal grain size from a value in conformance with an average length of line segments per crystal grain of the evaluation test line that crosses the inside of the crystal grain, which is evaluated in accordance with the intercept method of JISG0551:2013. The average crystal grain size of the target in the present embodiment is simultaneously determined from the EBSD measurement at the previously described r/2 point. It is a value that is calculated as an average value which is obtained by summing up the average grain sizes in the respective regions which have been equally divided into three in the thickness direction, and further equally dividing the resultant value by three, in a field of view of 1 mm in the width direction and 1 mm in the thickness direction observed at a magnification of 100 times.

As for the crystal grains in the sputtering target, it is desirable not only that an average of the grain sizes on the whole cross section is fine as has been described above, but also that the grain sizes are uniform in the target cross section. From this viewpoint, it is preferable that the standard deviation of the average crystal grain size in the present embodiment be 3% or smaller. If the standard deviation exceeds 3%, a dispersion of the grain sizes in the thickness direction of the target cross section is large, which leads to lowering of the stability of the deposition rate. It is more preferable for the standard deviation of the crystal grain sizes to be 2% or smaller, and still more preferable to be 1.3% or smaller. Incidentally, the standard deviation in the present embodiment is calculated from evaluation values of the respective regions which have been equally divided into three in the thickness direction.

Furthermore, it is preferable the sputtering target of the present embodiment have an oxygen content of 50 wtppm or less. Oxygen contained in the target is released during sputtering to cause a temporary change in the deposition rate, and contaminates the tungsten layer to be formed, as an impurity; and accordingly, it is preferable that the content in the target be reduced. It is preferable for the oxygen content in the target to be 40 wtppm or less, and still more preferable to be 30 wtppm or less. An oxygen concentration in the present embodiment refers to a value measured by a non-dispersive infrared absorption method (generally referred to as LECO method).

A production method of the sputtering target of the present embodiment is not limited in particular as long as the sputtering target has each of the above described characteristics. However, as a means for obtaining a tungsten sputtering target having such characteristics, a powder metallurgy process can be suitably used which has combined hot press (HP) with hot isostatic press (HIP). In order that the sputtering target of the present invention obtains a sintered body having the above described characteristics, particularly, a random structure concerning the orientation, and a high density, appropriate condition controls in HP and HIP are needed.

Firstly, the HP process is a process of filling a predetermined mold with a raw material tungsten powder, and heat-treating the powder while applying a load to the powder. As for the tungsten powder which is used here, it is preferable that a particle size be 1 to 50 μm. In the HP process, a suitable load is applied to the powder for every temperature region while raising the temperature at an appropriate rate of temperature rise to raise the temperature to the HP temperature. HP temperature is then kept for a predetermined time period. It is preferable that the rate of temperature rise here is approximately 0.1 to 4° C./min, and that the HP temperature is approximately 1600 to 2000° C. If the HP temperature is low, a sintered body with a high density cannot be obtained, If the HP temperature is too high exceeding 2000° C., a reaction with the mold and the coarsening of the crystal grains can be caused, which is not preferable. If the rate of temperature rise is too high, the crystal grains tend to result in orienting to a specific orientation, which is not preferable. If the rate of temperature rise is too low, lowering of the productivity is caused, which is obviously unpreferable.

In the HP process, it is preferable to appropriately adjust and change the load applied in the temperature range of 600 to 1200° C. and in the temperature range of 1200° C. or higher. In the HP process, degassing occurs at an initial stage of the temperature rise, and accordingly when a high load is applied in this process, sintering results in proceeding in such a state that the gas is not sufficiently removed; and then the sintered body is not highly densified, and results in containing a large amount of residual gas components such as oxygen. Therefore, in the HP process, the load is adjusted to be low in the low temperature region, and the load is adjusted to be high in the high temperature region. The sintered body is then highly densified and can be a sintered body having a small amount of residual oxygen. Specifically, it is preferable to adjust the load pressure in the temperature range of 600 to 1200° C. to approximately 80 to 150 kg/cm², and the load pressure in the temperature range of 1200° C. or higher to approximately 200 to 350 kg/cm². In addition, it is effective for obtaining a sintered body having a high density and random orientation to introduce a step of holding the mold at a fixed temperature for a certain period of time a few times, during the temperature raising step. The holding time here is approximately 30 to 240 minutes, and can be appropriately adjusted in consideration of conditions such as temperature. The holding time at the HP temperature can be similarly set and adjusted.

In order to form the HP-treated compact so as to have a structure consisting of such crystal grains that the orientation is random, the grain sizes do not vary and the shapes are isotropic, and also so as to be highly densified, it is effective to subject the HP compact to HIP treatment. As a guide, a temperature during the HIP treatment can be adjusted to 1600 to 1900° C., and a pressure can be adjusted to 1600 to 1900 kg/cm$^2$. If the treatment temperature and the pressure are lower than these values, the sintered body cannot be sufficiently densified. If the temperature and the pressure are higher than these values, the coarsening of the grain size is caused.

The sintered body after the HIP treatment is subjected to shape working and surface working as needed to produce the sputtering target. Incidentally, the above described means and application conditions are merely examples, and it is needless to say that the examples may be appropriately changed or adjusted.

The tungsten sputtering target according to the present embodiment is formed so that a crystalline metallographic structure has a uniform orientation structure in which a specific crystal plane is not oriented in the plane perpendicular to the sputtering surface. Accordingly, a uniform film deposition rate over the target life can be stably maintained. Because of this, in a process of treating a single substrate, a condition control is unnecessary to adjust complicated process parameters in order that the growth condition of the thin film becomes constant. In addition, in a process of treating a plurality of substrates in sequence, a stable film deposition rate is maintained among the substrates. Accordingly, there is no variation in the film thickness among the substrates; and it becomes possible to form thin films having a uniform performance. Because of this, it is also possible to reduce the variation in the performance among the produced semiconductor elements, enhance the yield, and reduce the production cost.

EXAMPLES

The present embodiment will be specifically described below on the basis of examples and comparative examples. The descriptions on the following examples and comparative examples are merely specific examples for facilitating the understanding of the technical contents of the present invention, and the technical scope of the present invention is not limited by these specific examples.

Example 1

A carbon die was filled with a tungsten powder having a purity of 5 N and an average particle size of 15 μm, and then HP was carried out in a vacuum chamber under conditions of raising the temperature from room temperature to 800° C. at 4° C./min, raising the temperature from 800° C. to 1200° C. at 2.5° C./min, keeping the temperature at 1200° C. for 60 minutes, raising the temperature from 1200° C. to 1400° C. at 2° C./min, keeping the temperature at 1400° C. for 60 minutes, raising the temperature from 1400° C. to 1600° C. at 2° C./min, keeping the temperature at 1600° C. for 60 minutes, raising the temperature from 1600° C. to 1800° C. at 2° C./min, keeping the temperature at 1800° C. for 120 minutes, and lowering the temperature from 1800° C. to room temperature at 2.5° C./min. The HP load applied during the process was set at 100 kg/cm$^2$ between 800° C. and 1200° C., and at 240 kg/cm$^2$ between 1200° C. and 1800° C. The thereby obtained HP compact was further subjected to the HIP treatment for 120 minutes under conditions of 1850° C. and 1800 kg/cm$^2$. The sintered body after the HIP treatment was subjected to shape working, and a sputtering target having a diameter of 400 mm and a thickness of 6 mm was formed.

In the cross section perpendicular to the surface which becomes a sputtering surface of the obtained sputtering target, the crystal grains were observed and analyzed with the use of IPF mapping by the EBSD method. The apparatus used for the observation and the analysis here was JSM-7001F, TTLS type field emission scanning electron microscope made by JEOL Ltd. combined with OIM 6.0-CCD/BS type crystal orientation analyzer. The observation and the analysis was performed on the cross section perpendicular to the sputtering surface of the sample at a predetermined one point in the middle (r/2 where r represents radius of target) between the central portion and the outer circumferential portion on the target surface. A region of 2 mm in a direction parallel to the sputtering surface and 6 mm in a thickness direction perpendicular to the sputtering surface of the cross section was equally divided into three regions of the upper, middle and lower stages in the thickness direction. Then, on the respective whole surfaces of the obtained three 2 mm×2 mm regions, an area ratio of the crystal grains having {100} plane, an area ratio of the crystal grains having {110} plane, and an area ratio of the crystal grains having {111} plane oriented to the sputtering surface were calculated; and an area ratio of portions where none of {100} plane, {110} plane and {111} plane were oriented to the sputtering surface. Then, the average values of three regions of the upper stage, the middle stage and the lower stage, and the standard deviation were determined.

As a result, the orientation plane having the highest average value of the area ratio was {110} plane among three of {100}, {110} and {111} planes, which were the main orientation planes with respect to the sputtering surface. Even the average value of {110} plane was 18.2%. The area ratio of the crystal grains having none of these three main orientation planes oriented to the sputtering surface was 60.9%. At the same time, the average crystal grain size in the cross-sectional structure was determined from the observation images of the crystal grains in the three regions of the upper stage, the middle stage and the lower stage, and consequently, such a result was obtained that an average of the three regions was 32.5 μm. In addition, a density was measured on this sputtering target by the Archimedes method, and the relative density was evaluated; and consequently, the result of 99.3% was obtained. Furthermore, a concentration of oxygen contained in the target was measured by a non-dispersive infrared absorption method (generally referred to as LECO method), and consequently was 20 wtppm. These results are collectively shown in Table 1.

Next, an evaluation test was performed on a stability of the film deposition rate of the sputtering target. The target was mounted on a cathode of a sputtering apparatus, an electric power of 15 kW was applied to the cathode in an argon atmosphere, and continuous sputtering was performed from 0 to 1000 kWh. During the sputtering, tungsten thin film thickness on the sample obtained by 15 seconds of deposition time was divided by 15 seconds of deposition time to determine a film deposition rate. The film deposition rate was determined after a lapse of every 100 kWh such as 100 kWh, 200 kWh, 300 kWh and so on, thereby, the film deposition rates in total of 10 time points were determined. Then, the average value and the fluctuation (standard deviation) of the obtained data of 10 film deposition rates were determined. The results are collectively shown in Table 1. In this example, the standard deviation was 0.16 for the average film deposition rate of 9.26 Å/sec. The result shows that an extremely good sputtering with a small fluctuation in the film deposition rate was able to be performed.

Example 2

A carbon die was filled with a tungsten powder having a purity of 5 N and an average particle size of 20 μm, and then HP was carried out in a vacuum chamber under conditions of raising the temperature from room temperature to 1200° C. at 2.5° C./min, keeping the temperature at 1200° C. for 60 minutes, raising the temperature from 1200° C. to 1400° C. at 2° C./min, keeping the temperature at 1400° C. for 60 minutes, raising the temperature from 1400° C. to 1600° C. at 2° C./min, keeping the temperature at 1600° C. for 60 minutes, raising the temperature from 1600° C. to 1800° C. at 2° C./min, keeping the temperature at 1800° C. for 120 minutes, and lowering the temperature from 1800° C. to room temperature at 2.5° C./min, The HP load applied during the process was set at 100 kg/cm$^2$ between 800° C. and 1200° C., and at 240 kg/cm$^2$ between 1200° C. and 1800° C. The thereby obtained HP compact was further subjected to the HIP treatment for 120 minutes under conditions of 1850° C. and 1800 kg/cm$^2$. The sintered body after the HIP treatment was subjected to shape working, and a sputtering target having the diameter of 400 mm and the thickness of 6 mm was formed.

Similarly to Example 1, the obtained sputtering target was subjected to the analyses of the crystal orientation in the cross section, the crystal grain size, the relative density and the oxygen concentration. As a result, the orientation plane having the highest average value of the area ratio was {110} plane among three of {100}, {110} and {111} planes, which were the main orientation planes with respect to the sputtering surface. Even the average value of {110} plane was 19.6%. The area ratio of the crystal grains having none of these three main orientation planes oriented to the sputtering surface was 58.2%. At the same time, the average crystal grain size in the cross-sectional structure was determined from the observation images of the crystal grains in the three regions of the upper stage, the middle stage and the lower stage, and consequently, such a result was obtained that an average of the three regions was 32.4 μm. In addition, such results were obtained that the relative density of this sputtering target was 99.4%, and the oxygen concentration was 30 wtppm.

Furthermore, the obtained sputtering target was subjected to the evaluation test concerning the stability of the film deposition rate, similar to that in Example 1. As a result, in this example, the standard deviation was 0.24 for the average film deposition rate of 9.05 Å/sec. The result shows that a good sputtering with a small fluctuation in the film deposition rate was able to be performed although the result was inferior to that in the previous example.

Example 3

A carbon die was filled with a tungsten powder having a purity of 5 N and an average particle size of 18 μm, and then HP was carried out in a vacuum chamber under conditions of raising the temperature from room temperature to 1200° C. at 2° C./min, keeping the temperature at 1200° C. for 60 minutes, raising the temperature from 1200° C. to 1400° C. at 2° C./min, keeping the temperature at 1400° C. for 90 minutes, raising the temperature from 1400° C. to 1600° C. at 2°C./min, keeping the temperature at 1600° C. for 60 minutes, raising the temperature from 1600° C. to 1800° C. at 2° C./min, keeping the temperature at 1800° C. for 120 minutes, and lowering the temperature from 1800° C. to room temperature at 2.5° C./min. The HP load applied during the process was set at 100 kg/cm$^2$ between 800° C. and 1200° C., and at 240 kg/cm$^2$ between 1200° C. and 1800° C. The thereby obtained HP compact was further subjected to the HIP treatment for 120 minutes under conditions of 1850° C. and 1800 kg/cm$^2$. The sintered body after the HIP treatment was subjected to shape working, and a sputtering target having the diameter of 400 mm and the thickness of 6 mm was formed.

Similarly to Example 1, the obtained sputtering target was subjected to the analyses of the crystal orientation in the cross section, the crystal grain size, the relative density and the oxygen concentration. As a result, the orientation plane having the highest average value of the area ratio was {110} plane among three of {100}, {110} and {111} planes, which were the main orientation planes with respect to the sputtering surface, Even the average value of {110} plane was 20.4%. The area ratio of the crystal grains having none of these three main orientation planes oriented to the sputtering surface was 57.0%. At the same time, the average crystal grain size in the cross-sectional structure was determined from the observation images of the crystal grains in the three regions of the upper stage, the middle stage and the lower stage, and consequently, such a result was obtained that an average of the three regions was 32.3 μm. In addition, such results were obtained that the relative density of this sputtering target was 99.2%, and the oxygen concentration was 20 wtppm.

Furthermore, the obtained sputtering target was subjected to the evaluation test concerning the stability of the film deposition rate, similar to that in Example 1. As a result, in this example, the standard deviation was 0.20 for the average film deposition rate of 9.14 Å/sec. The result shows that good sputtering with a small fluctuation in the film deposition rate was able to be performed.

Example 4

A carbon die was filled with a tungsten powder having a purity of 4 N and an average particle size of 16 μm, and then HP was carried out in a vacuum chamber under conditions of raising the temperature from room temperature to 800° C. at 4° C./min, raising the temperature from 800° C. to 1200° C. at 2.5° C./min, keeping the temperature at 1200° C. for 60 minutes, raising the temperature from 1200° C. to 1400° C. at 2° C./min, keeping the temperature at 1400° C. for 60 minutes, raising the temperature from 1400° C. to 1600° C. at 2° C./min, keeping the temperature at 1600° C. for 60 minutes, raising the temperature from 1600° C. to 1800° C. at 2° C./min, keeping the temperature at 1800° C. for 180 minutes, and lowering the temperature from 1800° C. to room temperature at 2.5° C./min. The HP load applied during the process was set at 100 kg/cm$^2$ between 800° C. and 1200° C., and at 300 kg/cm$^2$ between 1200° C. and 1800° C. The thereby obtained HP compact was further subjected to the HIP treatment for 120 minutes under conditions of 1850° C. and 1800 kg/cm$^2$. The sintered body after the HIP treatment was subjected to shape working, and a sputtering target having the diameter of 400 mm and the thickness of 6 mm was formed.

Similarly to Example 1, the obtained sputtering target was subjected to the analyses of the crystal orientation in the cross section, the crystal grain size, the relative density and the oxygen concentration. As a result, the orientation plane having the highest average value of the area ratio was {110} plane among three of {100}, {110} and {111} planes, which were the main orientation planes with respect to the sputtering surface. Even the average value of {110} plane was 20.7%. The area ratio of the crystal grains having none of these three main orientation planes oriented to the sputtering surface was 56.5%. At the same time, the average crystal grain size in the cross-sectional structure was determined from the observation images of the crystal grains in the three regions of the upper stage, the middle stage and the lower stage, and consequently, such a result was obtained that an average of the three regions was 39.8 μm. In addition, such results were obtained that the relative density of this sputtering target was 99.8%, and the oxygen concentration was 20 wtppm.

Furthermore, the obtained sputtering target was subjected to the evaluation test concerning the stability of the film deposition rate, similar to that in Example 1. As a result, in this example, the standard deviation was 0.26 for the average film deposition rate of 9.08 Å/sec. The result shows that good sputtering with a small fluctuation in the film deposition rate was able to be performed.

Example 5

A carbon die was filled with a tungsten powder having a purity of 5 N and an average particle size of 15 μm and then HP was carried out in a vacuum chamber under conditions of raising the temperature from room temperature to 800° C. at 4° C./min, raising the temperature from 800° C. to 1200° C. at 2.5°C./min, raising the temperature from 1200° C. to 1800° C. at 2° C./min, keeping the temperature at 1800° C. for 120 minutes, and lowering the temperature from 1800° C. to room temperature at 2.5° C./min. The HP load applied during the process was set at 240 kg/cm² between 800° C. and 1400° C. The thereby obtained HP compact was further subjected to the HIP treatment for 120 minutes under conditions of 1850° C. and 1800 kg/cm². The sintered body after the HIP treatment was subjected to shape working, and a sputtering target having the diameter of 400 mm and the thickness of 6 mm was formed.

Similarly to Example 1, the obtained sputtering target was subjected to the analyses of the crystal orientation in the cross section, the crystal grain size, the relative density and the oxygen concentration. As a result, the orientation plane having the highest average value of the area ratio was {110} plane among three of {100}, {110} and {111} planes, which were the main orientation planes with respect to the sputtering surface. Even the average value of (110) plane was 19.0%. The area ratio of the crystal grains having none of these three main orientation planes oriented to the sputtering surface was 58.7%. At the same time, the average crystal grain size in the cross-sectional structure was determined from the observation images of the crystal grains in the three regions of the upper stage, the middle stage and the lower stage, and consequently, such a result was obtained that an average of the three regions was 25.6 μm. In addition, the relative density of this sputtering target was 98.4%, and the oxygen concentration was 50 wtppm.

Furthermore, the obtained sputtering target was subjected to the evaluation test concerning the stability of the film deposition rate, similar to that in Example 1, As a result, in this example, the standard deviation was 0.35 for the average film deposition rate of 10.40 Å/sec, which was an acceptable result though the fluctuation was large as compared with those of Examples 1 to 4. The standard deviation of the film deposition rate is considered to be attributed to the lower density of the target as compared with Examples 1 to 4.

Comparative Example 1

A carbon die was filled with a tungsten powder having a purity of 5 N and an average particle size of 17 μm and then HP was carried out in a vacuum chamber under conditions of raising the temperature from room temperature to 800° C. at 4° C./min, raising the temperature from 800° C. to 1400° C. at 2° C./min, keeping the temperature at 1400° C. for 120 minutes, and lowering the temperature from 1400° C. to room temperature at 2.5° C./min. The HP load applied during the process was set at 240 kg/cm² between 800° C. and 1400° C. Furthermore, the obtained compact was subjected to reduction treatment in a hydrogen atmosphere as in a conventional way, and then was subjected to rolling treatment with a rolling reduction of 10% at a temperature of 1400° C. The obtained sintered body was subjected to shape working, and a sputtering target having the diameter of 400 mm and the thickness of 6 mm was formed.

Similarly to Example 1, the obtained sputtering target was subjected to the analyses of the crystal orientation in the cross section, the crystal grain size, the relative density and the oxygen concentration. As a result, such a result was obtained that the average value of the area ratios of crystal grains having {111} plane oriented to the sputtering surface was 35.7%, which exceeded 30%, and that {111} plane was preferentially oriented to the sputtering surface in the structure of the cross section. In addition, the average crystal grain size in the cross-sectional structure was determined from the observation images of the crystal grains in the three regions of the upper stage, the middle stage and the lower stage, and as a result, an average of the three regions was 54.5 μm and the grain size was coarsened. In addition, such results were obtained that the relative density of this sputtering target was 99.3%, and the oxygen concentration was 50 wtppm.

Furthermore, the obtained sputtering target was subjected to an evaluation test concerning the film deposition rate stability similar to that in Example 1. As a result, in this example, the standard deviation was 0.59 for the average film deposition rate of 11.70 Å/sec, which was a fluctuation more than twice that of Example 4, and the fluctuation of the film deposition rate with respect to the time period was noticeable. It is understood from this result that in a target which has undergone plastic working by hot-rolling treatment instead of HIP, {111} plane is oriented to the sputtering surface, and the stability of the film deposition rate becomes poor.

Comparative Example 2

A carbon die was filled with a tungsten powder having a purity of 5 N and an average particle size of 22 and then HP was carried out in a vacuum under conditions of raising the temperature from room temperature to 1200° C. at 2° C./min, keeping the temperature at 1200° C. for 60 minutes, raising the temperature from 1200° C. to 1400° C. at 2° C./min, keeping the temperature at 1400° C. for 90 minutes, raising the temperature from 1400° C. to 1600° C. at 2° C./min, keeping the temperature at 1600° C. for 60 minutes, raising the temperature from 1600° C. to 1800° C. at 2° C./min, keeping the temperature at 1800° C. for 120 minutes, and lowering the temperature from 1800° C. to room temperature at 2.5° C./min. The thereby obtained HP compact was further subjected to the HIP treatment for 90 minutes under conditions of 1950° C. and 1800 kg/cm², The sintered body after the HIP treatment was subjected to shape working, and a sputtering target having the diameter of 400 mm and the thickness of 6 mm was formed, Similarly to Example 1, the obtained sputtering target was subjected to the analyses of the crystal orientation in the cross section, the crystal grain size, the relative density and the oxygen concentration. As a result, such a result was obtained that the average value of the area ratios of crystal grains having {111} plane oriented to the sputtering surface became 39.1%, which exceeded 30%, and that {111} plane was preferentially oriented to the sputtering surface in the structure of the cross section. In addition, the average crystal grain size in the cross-sectional structure was determined from the observation images of the crystal grains in the three regions of the upper stage, the middle stage and the lower stage, and as a result, an average of the three regions was 101.8 μm and the grain size of the crystal grain was very coarsened. In addition, such results were obtained that the relative density of this sputtering target was 99.9%, and the oxygen concentration was 20 wtppm.

Furthermore, the obtained sputtering target was subjected to an evaluation test concerning the film deposition rate stability similar to that in Example 1. As a result, in this example, the standard deviation was 0.64 for the average film deposition rate of 12.07 Å/sec, in other words, the fluctuation of the film deposition rate with respect to the time period also became very large. It is understood from this result that although it can be expected that the density of the sintered body enhances by the rise of the temperature in the HIP process, {111} plane of the crystal grains are oriented to the sputtering surface, and besides, the crystal grains become coarsening, resulting in greatly deteriorating the stability of the film deposition rate.

Comparative Example 3

A carbon die was filled with a tungsten powder having a purity of 5 N and an average particle size of 12 μm, and then HP was carried out in a vacuum under conditions of raising the temperature from room temperature to 800° C. at 4° C./min, raising the temperature from 800° C. to 1200° C. at 2.5° C./min, keeping the temperature at 1200° C. for 60 minutes, raising the temperature from 1200° C. to 1400° C. at 2° C./min, keeping the temperature at 1400° C. for 60 minutes, raising the temperature from 1400° C. to 1600° C. at 2° C./min, keeping the temperature at 1600° C. for 60 minutes, raising the temperature from 1600° C. to 1800° C. at 2° C./min, keeping the temperature at 1800° C. for 120 minutes, and lowering the temperature from 1800° C. to room temperature at 2.5° C./min. The HP load applied during the process was set at 240 kg/cm² between 800° C. and 1800° C. The thereby obtained HP compact was further subjected to the HIP treatment for 120 minutes under conditions of 1850° C. and 1800 kg/cm². The sintered body after the HIP treatment was subjected to shape working, and a sputtering target having the diameter of 400 mm and the thickness of 6 mm was formed.

Similarly to Example 1, the obtained sputtering target was subjected to the analyses of the crystal orientation in the cross section, the crystal grain size, the relative density and the oxygen concentration. As a result, such a result was obtained that the average value of the area ratios of crystal grains having {111} plane oriented to the sputtering surface was 38.2%, which exceeded 30%, and that {100} plane was preferentially oriented to the sputtering surface in the structure of the cross section. In addition, the average crystal grain size in the cross-sectional structure was determined from the observation images of the crystal grains in the three regions of the upper stage, the middle stage and the lower stage, and consequently, such a result was obtained that an average of the three regions was 29.8 μm. In addition, such results were obtained that the relative density of this sputtering target was as low as 98.7%, and the oxygen concentration was 70 wtppm.

Furthermore, the obtained sputtering target was subjected to an evaluation test concerning the film deposition rate stability similar to that in Example 1. As a result, in this example, the standard deviation was 0.42 for the average film deposition rate of 7.90 Å/sec, in other words, the fluctuation of the film deposition rate with respect to the time period became large. It is understood from this result that when the load applied in the HP process is not adjusted and a large load is continuously applied from low temperature, sintering proceeds in such a state that degassing is insufficient, accordingly the density of the sintered body is insufficient, and besides the crystal grains have a structure in which {100} plane is oriented to the sputtering surface, resulting in deteriorating the stability of the film deposition rate.

Comparative Example 4

A carbon die was filled with a tungsten powder having a purity of 5 N and an average particle size of 13 μm, and then HP was carried out in a vacuum chamber under conditions of raising the temperature from room temperature to 1200° C. at 4° C./min, keeping the temperature at 1200° C. for 60 minutes, raising the temperature from 1200° C. to 1800° C. at 2.5° C./min, keeping the temperature at 1800° C. for 120 minutes, and lowering the temperature from 1800° C. to room temperature at 5° C./min. The HP load applied during the process was set at 100 kg/cm² between 800° C. and 1200° C., and at 300 kg/cm² between 1200° C. and 1800° C. The thereby obtained HP compact was further subjected to the HIP treatment for 120 minutes under conditions of 1850° C. and 1800 kg/cm². The sintered body after the HIP treatment was subjected to shape working, and a sputtering target having the diameter of 400 mm and the thickness of 6 mm was formed.

Similarly to Example 1, the obtained sputtering target was subjected to the analyses of the crystal orientation in the cross section, the crystal grain size, the relative density and the oxygen concentration. As a result, such a result was obtained that the average value of the area ratios of crystal grains having {100} plane oriented to the sputtering surface was 32.0%, which exceeded 30%, and that {100} plane was preferentially oriented to the sputtering surface in the structure of the cross section. In addition, the average crystal grain size in the cross-sectional structure was determined from the observation images of the crystal grains in the three regions of the upper stage, the middle stage and the lower stage, and consequently, such a result was obtained that an average of the three regions was 27.2 μm. In addition, such results were obtained that the relative density of this sputtering target was 99.1%, and the oxygen concentration was 60 wtppm.

Furthermore, the obtained sputtering target was subjected to the evaluation test concerning the stability of the film deposition rate, similar to that in Example 1. As a result, in this example, the standard deviation was 0.44 for the average film deposition rate of 8.11 Å/sec, in other words, the fluctuation of the film deposition rate with respect to the time period became large. It is understood from this result that also in the case where the rate of temperature rise in the HP process is high and the keeping step during the process is not sufficient, the degassing is insufficient and the crystal grains have a structure in which {100} plane is oriented to the sputtering surface, resulting in deteriorating the stability of the film deposition rate. In addition, the high oxygen concentration as high as in Comparative Examples 3 and 4 is considered to be effective for secondary electron emission in sputtering, and there is an effect of accelerating the sputtering, but it is considered that the fluctuation of the film deposition rate becomes large between the sputtered location at which oxygen concentration is high and that at which oxygen concentration is not so, which is considered to be disadvantageous for the stability of the film deposition rate.

The results of Examples 2 to 5 and Comparative Examples 1 to 4 are also collectively shown in the table, in addition to the result of the above described Example 1.

TABLE 1

| | | {100} | {110} | {111} | Others | Average grain size | Relative density | Oxygen concentration | Deposition rate (Å/sec) | Fluctuation of deposition rate |
|---|---|---|---|---|---|---|---|---|---|---|
| Example 1 | Top | 8.2 | 18.0 | 11.8 | 62.0 | 32.6 | 99.3% | 20 ppm | 9.28 | 0.16 |
| | Middle | 7.9 | 18.2 | 13.2 | 60.7 | 33.5 | | | | |
| | Bottom | 8.4 | 18.4 | 13.2 | 60.0 | 31.4 | | | | |
| | Average | 8.2 | 18.2 | 12.7 | 60.9 | 32.5 | | | | |
| | Standard deviation | 0.3 | 0.2 | 0.8 | 1.0 | 1.0 | | | | |
| Example 2 | Top | 8.6 | 19.4 | 13.5 | 58.5 | 33.1 | 99.4% | 30 ppm | 9.05 | 0.24 |
| | Middle | 8.4 | 19.4 | 14.0 | 58.2 | 32.7 | | | | |
| | Bottom | 8.5 | 19.9 | 13.8 | 57.8 | 31.4 | | | | |
| | Average | 8.5 | 19.8 | 13.8 | 58.2 | 32.4 | | | | |
| | Standard deviation | 0.1 | 0.3 | 0.3 | 0.4 | 0.9 | | | | |
| Example 3 | Top | 9.8 | 20.4 | 13.4 | 56.4 | 32.4 | 99.2% | 20 ppm | 9.14 | 0.20 |
| | Middle | 8.2 | 19.8 | 13.4 | 58.6 | 33.0 | | | | |
| | Bottom | 8.9 | 21.0 | 14.2 | 55.9 | 31.6 | | | | |
| | Average | 9.0 | 20.4 | 13.7 | 57.0 | 32.3 | | | | |
| | Standard deviation | 0.8 | 0.6 | 0.5 | 1.4 | 0.7 | | | | |
| Example 4 | Top | 10.0 | 20.7 | 13.4 | 55.9 | 41.0 | 99.8% | 20 ppm | 9.08 | 0.26 |
| | Middle | 9.8 | 20.1 | 13.1 | 57.0 | 38.4 | | | | |
| | Bottom | 8.6 | 21.3 | 13.4 | 56.7 | 39.9 | | | | |
| | Average | 9.5 | 20.7 | 13.3 | 56.5 | 39.8 | | | | |
| | Standard deviation | 0.8 | 0.6 | 0.2 | 0.6 | 1.3 | | | | |
| Example 5 | Top | 10.5 | 20.3 | 11.4 | 57.8 | 23.4 | 98.4% | 50 ppm | 10.40 | 0.35 |
| | Middle | 7.7 | 17.5 | 13.0 | 61.8 | 26.6 | | | | |
| | Bottom | 9.9 | 19.3 | 14.3 | 56.5 | 26.8 | | | | |
| | Average | 9.4 | 19.0 | 12.9 | 58.7 | 25.6 | | | | |
| | Standard deviation | 1.5 | 1.4 | 1.5 | 2.8 | 1.9 | | | | |
| Comparative Example 1 | Top | 10.8 | 15.8 | 33.1 | 40.3 | 48.8 | 99.3% | 50 ppm | 11.70 | 0.59 |
| | Middle | 11.3 | 13.2 | 39.5 | 36.0 | 58.1 | | | | |
| | Bottom | 11.2 | 12.7 | 34.4 | 41.7 | 56.7 | | | | |
| | Average | 11.1 | 13.9 | 35.7 | 39.3 | 54.5 | | | | |
| | Standard deviation | 0.3 | 1.7 | 3.4 | 3.0 | 5.0 | | | | |
| Comparative Example 2 | Top | 8.8 | 13.5 | 41.6 | 36.1 | 98.2 | 99.9% | 20 ppm | 12.07 | 0.64 |
| | Middle | 7.8 | 11.7 | 37.0 | 43.5 | 106.7 | | | | |
| | Bottom | 9.2 | 11.0 | 38.6 | 41.2 | 100.6 | | | | |
| | Average | 8.6 | 12.1 | 39.1 | 40.3 | 101.8 | | | | |
| | Standard deviation | 0.7 | 1.3 | 2.3 | 3.8 | 4.4 | | | | |
| Comparative Example 3 | Top | 35.5 | 13.9 | 10 | 40.6 | 30.5 | 98.7% | 70 ppm | 7.90 | 0.42 |
| | Middle | 42.1 | 14.2 | 11.5 | 32.2 | 27.0 | | | | |
| | Bottom | 36.9 | 12.6 | 11.0 | 39.5 | 31.8 | | | | |
| | Average | 38.2 | 13.6 | 10.8 | 37.4 | 29.8 | | | | |
| | Standard deviation | 3.5 | 0.9 | 0.8 | 4.6 | 2.5 | | | | |
| Comparative Example 4 | Top | 32.5 | 13.5 | 13.5 | 40.5 | 25.3 | 99.1% | 60 ppm | 8.11 | 0.44 |
| | Middle | 31.9 | 13.0 | 14.0 | 41.1 | 25.9 | | | | |
| | Bottom | 31.7 | 12.5 | 13.9 | 41.9 | 30.3 | | | | |
| | Average | 32.0 | 13.0 | 13.8 | 41.2 | 27.2 | | | | |
| | Standard deviation | 0.4 | 0.5 | 0.3 | 0.7 | 2.7 | | | | |

INDUSTRIAL APPLICABILITY

According to the present embodiment, a stable film deposition rate with less fluctuation over the target life can be maintained in the sputtering film-deposition of the tungsten layer.

What is claimed is:

1. A tungsten sputtering target, wherein an area ratio of crystal grains having {100} planes oriented to a sputtering surface is in a range of 7.2 to 13.2%, an area ratio of crystal grains having {110} planes oriented to the sputtering surface is in a range of 20.4 to 23.4%, an area ratio of crystal grains having {111} planes oriented to the sputtering surface is in a range of 10.6 to 16.6%, and an area ratio in total of crystal grains having orientation planes oriented to the sputtering surface other than {100}, {11} and {111} planes is 46.8 to 62.1%, the area ratio being obtained by an analysis of a cross section perpendicular to the sputtering surface with an inverse pole figure mapping using electron backscatter diffraction.

2. The sputtering target according to claim 1, wherein a relative density is 99.0% or higher.

3. The tungsten sputtering target according to claim 1, wherein a standard deviation of the area ratio of crystal grains having any of {100}, {110} and {111} planes oriented to the sputtering surface is 3% or smaller.

4. The tungsten sputtering target according to claim 1, wherein a standard deviation of the area ratio in total of crystal grains having orientation planes oriented to the sputtering surface other than {100}, {110} and {111} planes is 3% or smaller.

5. The tungsten sputtering target according to claim 1, wherein an average crystal grain size on the sputtering surface is 50 μm or smaller.

6. The tungsten sputtering target according to claim 1, wherein a standard deviation of an average crystal grain size on the sputtering surface is 3% or smaller.

7. The tungsten sputtering target according to claim 1, wherein an oxygen content is 50 wtppm or less.

* * * * *